United States Patent [19]

Sakamoto

[11] Patent Number: 5,422,491
[45] Date of Patent: Jun. 6, 1995

[54] MASK AND CHARGED PARTICLE BEAM EXPOSURE METHOD USING THE MASK

[75] Inventor: Kiichi Sakamoto, Tokyo, Japan

[73] Assignee: Fujitsu Limited, Kawasaki, Japan

[21] Appl. No.: 277,137

[22] Filed: Jul. 19, 1994

Related U.S. Application Data

[63] Continuation of Ser. No. 182,362, Jan. 18, 1994, abandoned, which is a continuation of Ser. No. 73,615, Jun. 8, 1993, abandoned, which is a continuation of Ser. No. 974,666, Nov. 12, 1992, abandoned, which is a continuation of Ser. No. 893,887, Jun. 4, 1992, abandoned, which is a continuation of Ser. No. 745,758, Aug. 16, 1991, abandoned, which is a continuation-in-part of Ser. No. 429,498, Oct. 31, 1989, abandoned.

[30] Foreign Application Priority Data

Nov. 4, 1988 [JP] Japan .................. 63-279605

[51] Int. Cl.$^6$ .......................................... H01J 37/304
[52] U.S. Cl. .................. 250/492.22; 250/491.1; 250/398
[58] Field of Search ................ 250/492.2 R, 492.22, 250/491.1, 398; 378/34, 35

[56] References Cited

U.S. PATENT DOCUMENTS

| | | | |
|---|---|---|---|
| 4,213,053 | 7/1980 | Pfeiffer | 250/492 |
| 4,334,156 | 6/1982 | Bohlen et al. | 250/491 |
| 4,370,554 | 1/1983 | Bohlen et al. | 250/492.2 |
| 4,603,473 | 8/1986 | Suemitsu et al. | 29/578 |
| 4,823,011 | 4/1989 | Stengl et al. | 250/491.1 |
| 4,823,012 | 4/1989 | Kosugi | 250/491.1 |
| 4,849,313 | 7/1989 | Chapman et al. | 430/5 |
| 4,853,549 | 8/1989 | Yanagisawa et al. | 250/492.22 |
| 4,939,052 | 7/1990 | Nakagawa | 378/35 |

FOREIGN PATENT DOCUMENTS

| | | |
|---|---|---|
| 2231916 | 8/1987 | European Pat. Off. |
| 0286086 | 10/1988 | European Pat. Off. |

OTHER PUBLICATIONS

Levi, "A Line Electron Lens", J. Vac. Sci. Technol. B3(1), Jan./Feb. 1985, pp. 194-197.

Randal et al., "Masked Ion Beam Resist Exposure Using Grid Support Stencil Masks", J. Vac. Sci. Technol. B3(1), Jan./Feb. 1985, pp. 58-61.

Zapka et al., "High Resolution Distortion Measurements of Electron-Beam Transmission Masks", J. Vac. Sci. Technol. B3(1), Jan./Feb. 1985, pp. 140-143.

*Primary Examiner*—Jack I. Berman
*Assistant Examiner*—Kiet T. Nguyen
*Attorney, Agent, or Firm*—Staas & Halsey

[57] ABSTRACT

A charged particle beam exposure method exposes a desired exposure pattern on a substrate by a charged particle beam of a beam source and a deflection system for deflecting the charged particle beam transmitted through a mask. The method includes providing the mask having formed therein a plurality of exposure patterns and a plurality of position matching patterns, where each of the position matching patterns has a predetermined, fixed positional relationship to at least an adjacent exposure pattern in the mask, in a first step, exposing a first one of the plurality of position matching patterns in the mask at a predetermined position on the substrate by directing the charged particle beam through the selected position matching pattern in the mask and onto the predetermined position on the substrate, in a second step, detecting the irradiating position of the charged particle beam on the substrate, as directed through the first position matching pattern, in a third step, calculating an error between the predetermined position on the substrate and the irradiating position of the charged particle beam which is irradiated on the substrate through the first position matching pattern, in a fourth step, determining a correction amount for the desired exposure pattern which is adjacent to the first position matching pattern in the mask based on the calculated error, and in a fifth step, controlling the deflection system based on the correction amount so that the calculated error becomes approximately zero.

25 Claims, 8 Drawing Sheets

MASK AND CHARGED PARTICLE BEAM EXPOSURE METHOD USING THE MASK

CROSS-REFERENCE TO RELATED APPLICATION

This application is a continuation of U.S. application No. 08/182,362, filed Jan. 18, 1994, now abandoned, which is a continuation of U.S. application No. 08/073,615 filed Jun. 8, 1993, now abandoned, which is a continuation of U.S. application No. 07/974,666 filed Nov. 12, 1992, now abandoned, which is a continuation of U.S. application No. 07/893,887 filed Jun. 4, 1992, now abandoned, which is a continuation of U.S. application No. 07/745,758 filed Aug. 16, 1991, now abandoned, which is a CIP of U.S. application No. 07/429,498 filed Oct. 31, 1989, now abandoned.

BACKGROUND OF THE INVENTION

The present invention generally relates to masks and exposure methods using the masks, and more particularly to a mask which is used to form a desired pattern by use of a charged particle beam such as an electron beam and an exposure method which uses the mask to efficiently and stably form the desired pattern.

Heretofore, photolithography mainly has been used for forming fine patterns. But recently, due to the further increase in the integration density of integrated circuits, new exposure techniques have been developed and reduced to practice. The new exposure techniques use an X-ray and a charged particle beam such as an electron beam.

The charged particle beam exposure forms a pattern by use of a charged particle beam such as an electron beam which can be controlled electro-magnetically. One notable feature of the charged particle beam exposure is the fact that it is possible to form fine patterns in the submicron order. The charged particle beam exposure can generally be classified into a Gaussian beam exposure and a shaped beam exposure. These exposure techniques can further be divided into a system of drawing while continuously moving a substrate by continuously moving a stage and a step-and-repeat system of drawing while moving the substrate a predetermined amount for every drawing region.

The trend to further increase the integration density of integrated circuits is rapidly accelerating. Compared to the optical beam, the diameter of the minimum spot which can be formed by the electron beam is far smaller than that achievable by the optical beam. For this reason, the electron beam exposure fully satisfies the demand for increased integration density from the point of view of the resolution. However, from the practical point of view, there is a problem in that the exposure time is long. This problem of long exposure time is caused by the fact that the charged particle beam exposure method draws in one stroke.

In the semiconductor device production apparatus which employs the electron beam exposure method, various methods have been proposed to reduce the exposure (drawing) time. One proposed method exposes the pattern in parts by use of a transmission mask which has predetermined patterns so as to reduce the exposure time. Another method uses a transmission mask which has a pattern formed for the entire exposure region and exposes the pattern in one shot. Still another method uses a transmission mask which has patterns for exposing a selected pattern using a shaped electron beam with a rectangular shape, a square shape, a triangular shape or the like.

For example, a Japanese Laid-Open Patent Application No. 52-119185 proposes a method of selectively irradiating an electron beam on a transmission mask which has different patterns formed at different block positions, and one block is exposed in one shot. A method of exposing a desired pattern by use of a transmission mask which is formed with the desired pattern in its entirety is reported in J. Vac. Sci. Technol. B3(1), Jan/Feb 1985(140). A method of forming the transmission mask which may be used in these methods is reported in J. Vac. Sci. Technol. B3(1), Jan/Feb 1985(58). A method of reducing the pattern to 1/10 similarly to the step-and-repeater of an ion beam exposure is reported in J. Vac. Sci. Technol. B3(1), Jan/Feb 1985(194). Furthermore, a Japanese Laid-Open Patent Application No. 62-260322 proposes an electron beam exposure apparatus which makes an exposure using a stop plate having rectangular holes for forming a repetition pattern which is necessary for forming a memory cell or the like and a general rectangular pattern.

Out of the above proposed methods, the method proposed in the Japanese Laid-Open Patent Application No. 62-260322 was most suited for reducing the exposure time.

FIG. 1 is a perspective view of a semiconductor device production apparatus for explaining a conventional electron beam exposure method proposed in the Japanese Laid-Open Patent Application No. 62-260322. In FIG. 1, the semiconductor device production apparatus comprises an electron gun 51, a first rectangular aperture 52, a convergent lens 53, and an electrostatic deflector 54 for selecting a mask pattern and varying a transmitting beam size. The deflector 54 has a function of moving an electron beam and at least one such deflector is normally necessary when making the exposure with a variable rectangular shaped beam. In FIG. 1 there are also shown a transmission mask 55 which is also referred to as a stencil mask, a design pattern 56, and a wafer 57 which is to be subjected to the exposure.

The design pattern 56 is preformed in the transmission mask 55. This design pattern 56 may be formed by a variable shaped beam which has a rectangular shape, a square shape, a triangular shape or the like, for example. Transmission holes through which the electron beam is transmitted are formed in the transmission mask 55, and groups of design patterns 56 are formed within the same layer as these transmission holes. A convergent lens (not shown) is provided between the deflector 54 and the transmission mask 55.

A description will now be given of the operating principle of this conventional semiconductor device production apparatus. As shown in FIG. 1, the transmission mask 55 which comprises the groups of design patterns 56 within the same layer as the electron beam shaping or exposure is located at a position where the electron beam passes, so that the exposure is made by selectively irradiating the electron beam on the groups of design patterns 56. The group of design patterns 56 on the transmission mask 55 is selected by deflecting the electron beam to a focal point position by use of the deflector 54. The pattern is exposed on the wafer 57 by the appropriate projection of the electron beam which is transmitted through the transmission holes in the transmission mask 55.

The method of providing the plurality of patterns on the transmission mask and deflecting the electron beam depending on the pattern to be used for the exposure is an effective method from the point of view of realizing a high-speed exposure. But when the electron beam is deflected by a deflecting system, an image distortion is inevitably introduced at the wafer surface. In other words, even when the electron beam is deflected to irradiate the same position on the wafer through two patterns of the transmission mask located at mutually different positions, the irradiated position on the wafer becomes different for the two cases, that is, different for the two patterns used. Therefore, there is a need to correct the irradiating position of the electron beam on the wafer depending on the pattern used, that is, the position of the pattern in the transmission mask.

It is possible to detect the irradiating position of the electron beam on the wafer by use of a reflected electron beam detector which detects the electron beam which is reflected at the wafer surface. However, because the patterns of the transmission mask are complex and mutually different, it is impossible to accurately detect whether or not the irradiating position of the electron beam through the two patterns actually coincide on the wafer. Hence, an operator monitors an image on a scanning electron microscope (SEM) to approximately determine the image distortion based on the images obtained for the two patterns of the transmission mask, but it takes time to make the required measurements and the measured results are not very accurate. Further, the irradiating position of the electron beam on the wafer through a pattern of the transmission mask inevitably changes with time even when the same pattern is used due to impurities and the like which adhere on the transmission mask. But the efficiency of the exposure apparatus becomes extremely poor if the above described measurements must be carried out frequently to correct the image distortion prior to the actual exposure.

SUMMARY OF THE INVENTION

Accordingly, it is a general object of the present invention to provide a novel and useful mask and a particle beam exposure method using the mask, in which the above described problems are overcome.

Another and more specific object of the present invention is to provide a mask for use in exposing a desired pattern on a substrate by a charged particle beam exposure and particularly a mask comprising a plurality of pattern groups each including a plurality of patterns within an approximately rectangular region, and a plurality of position matching patterns formed at positions different from those of the pattern groups, where positional relationships of each of the pattern groups and the position matching patterns are predetermined and fixed. According to the mask of the present invention, it is possible to calculate the amount of correction for eliminating an image distortion at the substrate surface by use of the position matching patterns in the mask, prior to the actual exposure of a desired pattern.

Still another object of the present invention is to provide a charged particle beam exposure method for exposing a desired exposure pattern on a substrate by a charged particle beam of a beam source and a deflection system for deflecting the charged particle beam transmitted through a mask, comprising, providing the mask having formed therein a plurality of exposure patterns and a plurality of position matching patterns, where each of said position matching patterns has a predetermined, fixed positional relationship to at least an adjacent exposure pattern in the mask, in a first step, exposing a first one of the plurality of position matching patterns in the mask at a predetermined position on the substrate by directing the charged particle beam through the selected position matching pattern in the mask and onto the predetermined position on the substrate, in a second step, detecting the irradiating position of the charged particle beam on the substrate, as directed through said first position matching pattern, in a third step, calculating an error between the predetermined position on the substrate and the irradiating position of the charged particle beam which is irradiated on the substrate through said first position matching pattern, in a fourth step, determining a correction amount for the desired exposure pattern which is adjacent to said first position matching pattern in the mask based on the calculated error, and in a fifth step, controlling the deflection system based on the correction amount so that the calculated error becomes approximately zero. According to the charged particle beam exposure method of the present invention, it is possible to calculate the correction amount for eliminating an image distortion at the substrate surface by use of the position matching patterns in the mask prior to the actual exposure of the desired pattern. Therefore, the image distortion at the substrate surface is positively eliminated regardless of the position of the selected desired pattern in the mask, that is, regardless of the deflection quantity of the charged particle beam.

A further object of the present invention is to provide a charged particle beam exposure method for exposing a desired exposure pattern on a substrate by a charged particle beam of a beam source and a deflection system for deflecting the charged particle beam transmitted through a mask, comprising, providing the mask having formed therein a plurality of exposure patterns and at least four position matching patterns, where each of the four position matching patterns has a predetermined, fixed positional relationship to the exposure patterns in the mask, in a first step, exposing the four position matching patterns in the mask at predetermined positions on the substrate by directing the charged particle beam through the four position matching patterns in the mask and onto the predetermined positions on the substrate, in a second step, detecting the irradiating positions of the charged particle beam on the substrate, as directed through the four position matching patterns, in a third step, calculating an error between each of the predetermined positions on the substrate and the corresponding irradiating positions of the charged particle beam which is irradiated on the substrate through the four position matching patterns, in a fourth step, determining a correction amount for the desired exposure pattern in the mask based on the calculated errors, and in a fifth step, controlling the deflection system based on the correction amount so that the calculated error becomes approximately zero.

Other objects and further features of the present invention will be apparent from the following detailed description when read in conjunction with the accompanying drawings.

DESCRIPTION OF THE PREFERRED EMBODIMENTS

Figure 2:
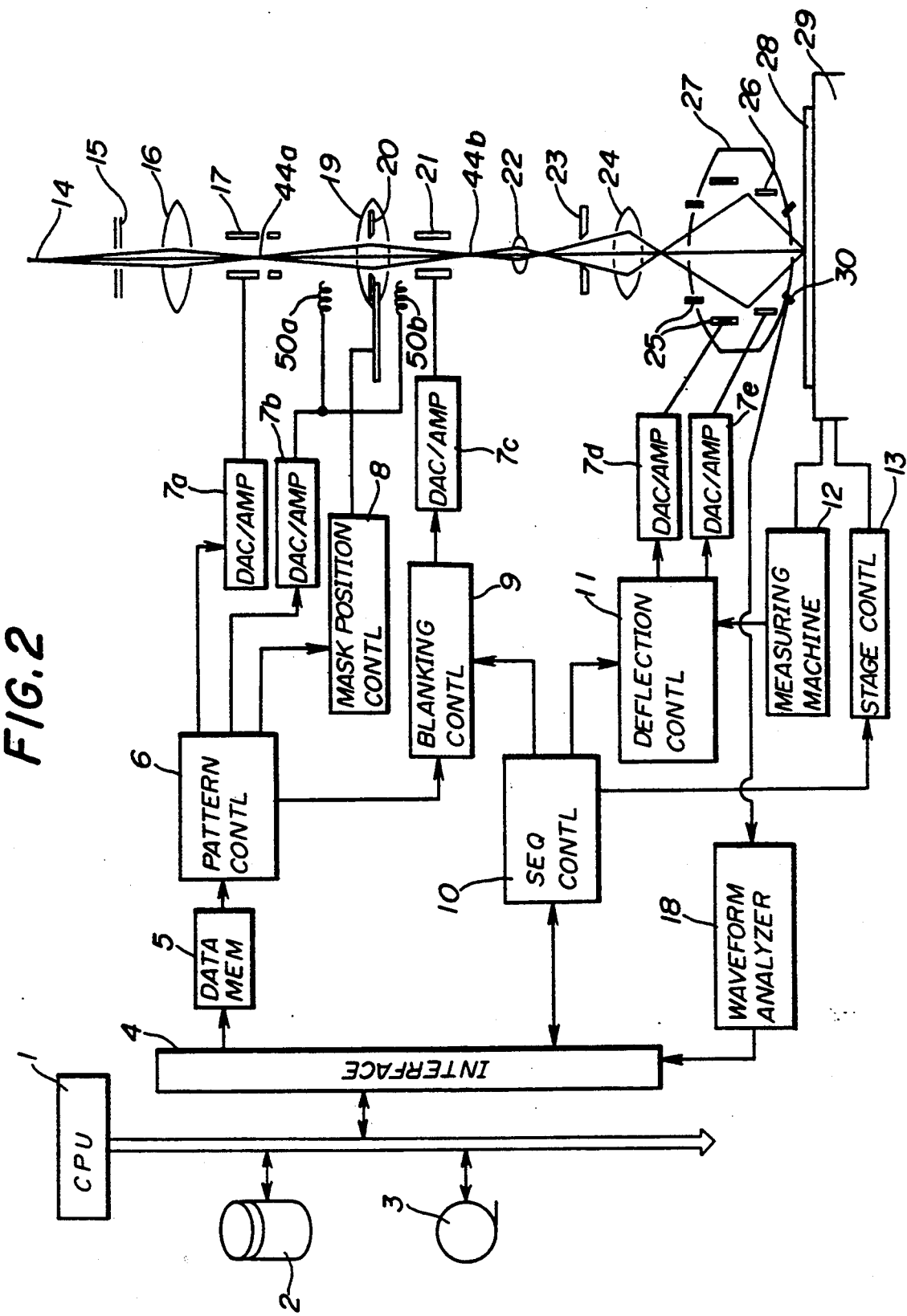
FIG. 2 is a diagram generally showing an exposure apparatus which is employed and operated in accordance with the charged particle beam exposure method according to the present invention.

FIG. 2 generally shows an exposure apparatus which is operated in accordance with an embodiment of a charged particle beam exposure method according to the present invention. The exposure apparatus comprises a central processing unit (CPU) 1, a magnetic disk 2, a magnetic tape 3, an interface 4, a data memory 5, a pattern controller 6, digital-to-analog converter and amplifiers (hereinafter simply referred to as DAC-/AMPs) 7a through 7e, a mask position control circuit 8, a blanking control circuit 9, a sequence controller 10, a deflection control circuit 11, a laser interferometric measuring machine 12, a stage controller 13, and an electron gun 14 which is used as an electron beam generating means for generating an electron beam. An aperture 15 functions as an electron beam shaping means. A first lens 16, an electrostatic deflector 17, a waveform analyzer circuit 18, and a second lens 19 which functions as an electromagnetic lens are also provided in the exposure apparatus. Deflectors 50a and 50b are provided for selecting a desired pattern in a transmission mask 20. The exposure apparatus further comprises a blanking part 21, a reduction lens 22 which functions as an electromagnetic lens, an aperture 23, a reduction lens 24 which functions as an electromagnetic lens, a main deflector 25, a sub deflector 26, an objective lens 27, a stage 29 for holding a wafer 28 and having a function of appropriately moving the position of the wafer 28, and a reflected electron detector 30. In FIG. 2, 44a and 44b are crossover points.

Figure 3:
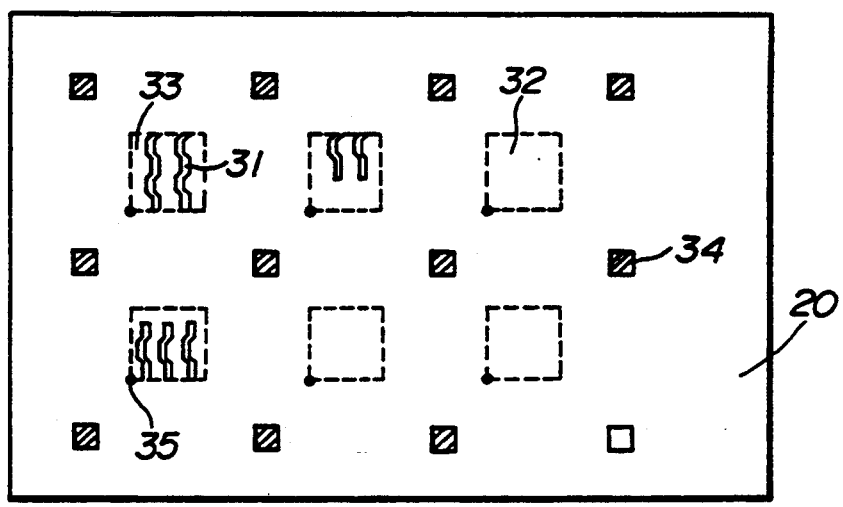
FIG. 3 is a plan view showing a first embodiment of a mask according to the present invention.

FIG. 3 shows a first embodiment of the transmission mask 20. In FIG. 3, the transmission mask 20 comprises transmission holes 31, rectangular holes 32 for forming variable rectangular shapes, pattern groups 33 respectively made up of the transmission holes 31, position matching patterns 34, and reference points 35 provided within the respective pattern groups 33.

Figure 4A:
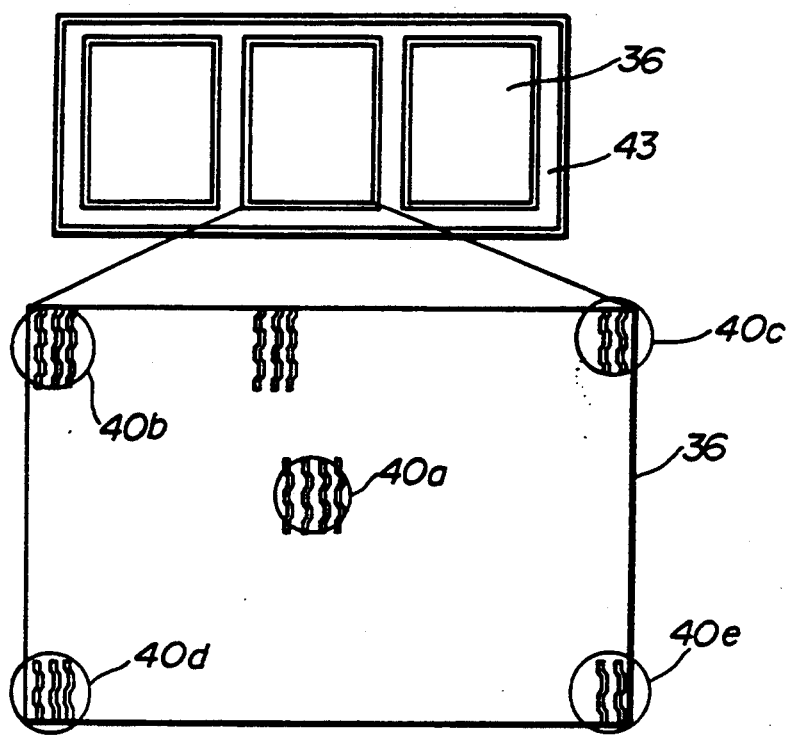
FIGS. 4A, 4B and 4C respectively are diagrams for explaining a pattern which is exposed by the charged particle beam exposure method according to the present invention.
Figure 4B:
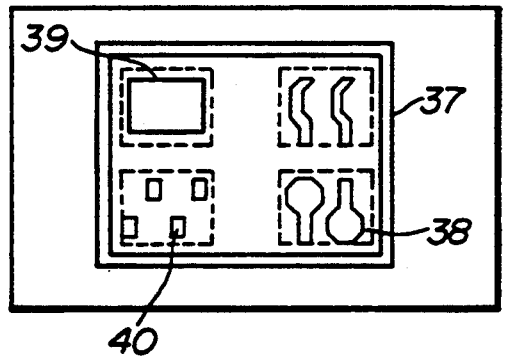
Figure 4C:
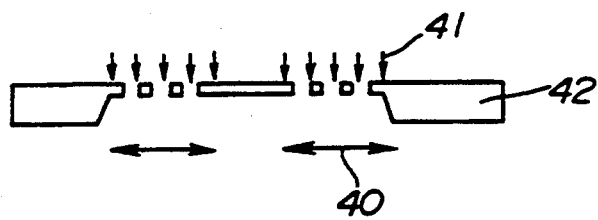

FIGS. 4A, 4B and 4C respectively are diagrams for explaining a pattern which is exposed in the embodiment of the charged particle beam exposure method according to the present invention. FIG. 4A shows a cell pattern part and a peripheral pattern part of an IC chip which is exposed, FIG. 4B shows a mask pattern for the exposed IC pattern by extracting those patterns (such as 40a through 40e) shown in FIG. 4A which are used frequently, and FIG. 4C shows a cross section of the IC chip (substrate 42). In FIGS. 4A to 4C there are shown a cell pattern part 36, an electron beam deflectable region 37, a pattern formable region 38, an hole 39 for a non-repetitive pattern, a pattern 40, an electron beam 41, a substrate 42 which is made of silicon (Si), for example, a peripheral pattern part 43.

The reduction lenses 22 and 24 respectively function as a means for reducing the electron beam which is transmitted therethrough. The main and sub deflectors 25 and 26 function as a means for deflecting the electron beam on the wafer 28.

Next, a description will be given of the operating principle of the exposure apparatus shown in FIG. 2. Data related to the variable rectangular shape or the like are input to the CPU 1 from the magnetic disk 2 or the magnetic tape 3. Each pattern data is supplied to the pattern controller 6 via the interface 4 and the data memory 5. The electrostatic deflector 17 is controlled by the pattern controller 6 via the DAC/AMP 7a and the size of the electron beam and the like are controlled for the variable rectangular shape. The position of the pattern to be selected in the transmission mask 20 is also controlled by the pattern controller 6 which controls the deflectors 50a and 50b via the DAC/AMP 7b. The mask position control circuit 8 controls the position of the transmission mask 20 in response to an output of the pattern controller 6. The blanking control circuit 9 determines whether or not to project the pattern based on outputs of the pattern controller 6 and the sequence controller 10 which are obtained via the DAC/AMP 7c. The main deflector 25 determines a large range to be exposed in response to an output of the deflection control circuit 11 which is obtained via the DAC/AMP 7d, and the sub deflector 26 determines the position of the electron beam spot in response to an output of the deflection control circuit 11 which is obtained via the DAC/AMP 7e. The spot position is measured by the laser interferometric measuring machine 12 which measures the position of the stage 29, and the measured data is supplied to the deflection control circuit 11. The main and sub deflectors 25 and 26 are readjusted based on the control of the deflection control circuit 11.

When the electron beam is rotated and irradiated on the wafer 28, the spot position is measured by the reflected electron detector 30 which detects the reflected electrons from the wafer 28. The measured data from the reflected electron detector 30 is supplied to the waveform analyzer circuit 18. Necessary calculations on the measured data are made in the CPU 1 which receives the measured data via the interface 4. The second lens 19 and the reduction lenses 22 and 24 are readjusted based on control outputs of the waveform analyzer circuit 18.

For the sake of convenience, it is assumed that FIGS. 4A through 4C show the pattern of the semiconductor device to be exposed by the exposure apparatus. FIGS. 4A through 4C show the case where the semiconductor device is a dynamic random access memory (DRAM). The semiconductor device in this case is generally formed from the cell pattern part 36 which actually stores the information and the peripheral pattern part 43 which supervises the cell pattern part 36 or supervises the signal communication between the semiconductor device and an external device. In order to improve the integration density, the cell pattern part 36 is formed with fine pattern rulings as shown in FIG. 4A, and the cell pattern part 36 comprises a repetition of a minimum number of basic patterns each including several cells. The pattern groups 33 of the transmission mask 20 respectively have a pattern 40a which includes a repetitive pattern, and patterns 40b, 40c and 40d which include no repetitive patterns but are fine patterns.

Figure 1:
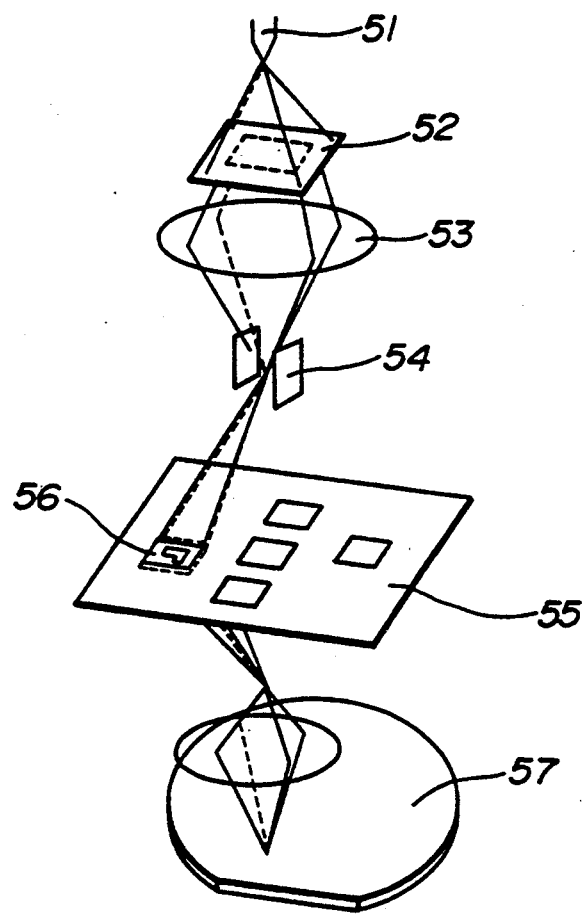
FIG. 1 is a perspective view showing a semiconductor device production apparatus for explaining a conventional electron beam exposure method.

In order to efficiently expose such patterns, the transmission mask 20 must have a plurality of pattern groups 33, and the efficiency of the exposure is better if the number of the pattern groups 33 is large. The principle of the exposure is basically the same as that described before in conjunction with FIG. 1. In other words, the transmission mask 20 which comprises the pattern groups 33 is arranged at a position where the electron beam passes, within a layer in which the electron beam is shaped or exposed, so as to irradiate a selected pattern group 33 by the electron beam to make the exposure. The desired pattern group 33 is selected by deflecting the electron beam to the focal point by use of the electrostatic deflector 17. The pattern is exposed on the wafer 28 by the appropriate projection of the electron beam which passes the transmission holes 31 onto the wafer 28.

In this embodiment, the transmission mask 20 which is used has in addition to the pattern groups 33 the plurality of position matching patterns 34. The positional relationship between the pattern groups 33 and the position matching patterns 34 is predetermined. When exposing the pattern group 33, the exposure is made by determining irradiating position of the electron beam on the transmission mask 20 with reference to the position matching patterns 34. Accordingly, it is possible to provide in the transmission mask 20 a plurality of pattern groups 33 for the exposure and to accurately expose the patterns on the wafer 28 regardless of the position of each pattern in the transmission mask 20. The exposure of the patterns on the wafer 28 can be made efficiently within a short time.

It is possible to stably make the exposure when the positional relationship is known between the position on the transmission mask 20 where the electron beam is irradiated and the irradiating position on the wafer 28. In order to know this positional relationship, the irradiating position on the wafer 28 is monitored by use of the position matching pattern 34, and when exposing the pattern group 33 the irradiating position of the electron beam on the transmission mask 20 is determined with reference to the position matching pattern 34.

The region in which the pattern groups 33 are formed in the transmission mask 20 is determined but the patterns of the transmission holes 31 are actually formed in a portion of the region and only the patterns of the transmission holes 31 can be discriminated on the wafer 28. Accordingly, in order to satisfactorily and stably make the exposure, it is desirable to form the reference point 35 within the pattern group 33 in the transmission mask 20 as shown in FIG. 3, form the position matching patterns 34 in the matrix arrangement, and form the pattern groups 33 so that the positional relationship between the reference point 35 within the pattern group 33 and one or plurality of position matching patterns 34 is predetermined and fixed. The exposure data includes the position of the reference point 35 and the mask pattern in the coded form.

When many patterns are arranged in the transmission mask 20 and one pattern is selected by deflecting the electron beam, the patterned electron beam is easily distorted. Hence, it is desirable to detect whether or not the electron beam is distorted and to correct the electron beam when the distortion exists.

The electrostatic deflector 17 forms a first deflection system. On the other hand, the blanking part 21, the main deflector 25, the sub deflector 26, the objective lens 27 and the deflector 50b form a second deflection system. According to the present invention, the deflection quantity of the second deflection system is corrected so that the electron beam transmitted through the block pattern of the transmission mask 20 is irradiated at a predetermined position on the wafer 28. In the present invention, it is assumed that the first deflection system is already adjusted and the electron beam emitted from the electron gun 14 is deflected by the first deflection system and accurately irradiates a predetermined position on the transmission mask 20.

Even when the electron beam transmitted through the transmission mask 20 is accurately deflected by the second deflection system based on designed values, the electron beam will not irradiate the predetermined position on the wafer 28 for the following two reasons.

Figure 6:
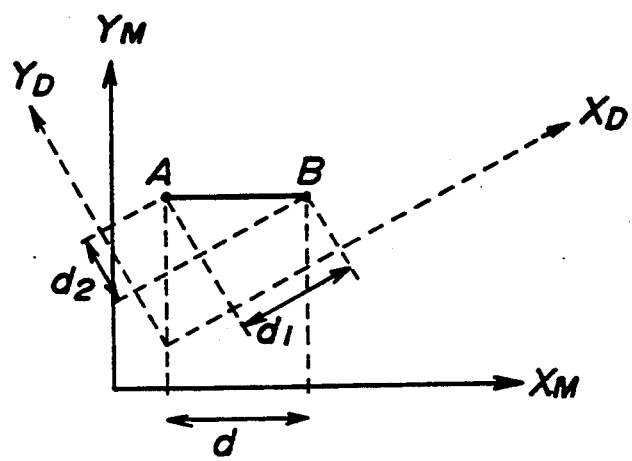
FIG. 6 is a diagram for explaining an error which occurs when the coordinate system of the transmission mask does not match the coordinate system of the second deflection system.

First, the coordinate system on the transmission mask 20 does not match the coordinate system of the second deflection system. For example, let us assume that the coordinate system on the transmission mask 20 viewed from above the transmission mask 20 is $X_M-Y_M$ as indicated by a solid line in FIG. 6, while the coordinate system of the second deflection system is $X_D-Y_D$ as indicated by a broken line in FIG. 6. When the coordinate system on the transmission mask 20 is shifted from the coordinate system of the second deflection system, the positional relationship of two points on the coordinate system is described differently between the two coordinate systems. In other words, the two points A and B are separated by a distance d in the X-axis direction on the coordinate system on the transmission mask 20, but the same two points A and B are separated by a distance d1 in the X-axis direction and by a distance d2 in the Y-axis direction on the coordinate system of the second deflection system. Accordingly, when the coordinate system on the transmission mask 20 and the coordinate system of the second deflection system do not match and the control signal for controlling the second deflection system is described using the coordinate system of the transmission mask 20, the second deflection system cannot accurately deflect the electron beam to the predetermined position on the wafer 28.

Figure 7:
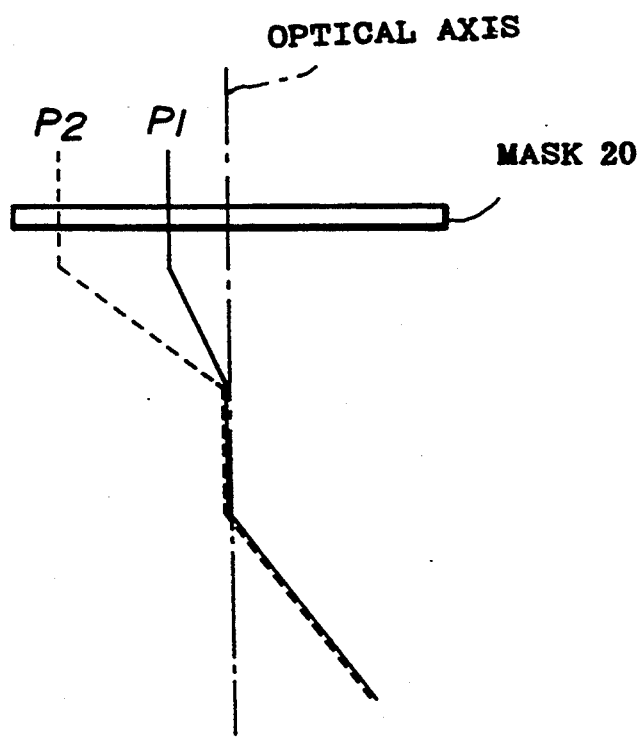
FIG. 7 is a diagram for explaining an error which occurs due to aberration.

Second, even if the correction with regard to the coordinate system referred above is completed, the position where the electron beam is actually irradiated on the wafer 28 will not accurately match the position described by the designed values. In other words, the electron beam which is transmitted through the transmission mask 20 is once swung back on the optical axis before being deflected to be irradiated at the predetermined position on the wafer 28. After the correction with regard to the coordinate system referred above is completed, the electron beam should be irradiated at positions on the wafer 28 corresponding to the positions on the transmission mask 20 by applying the same deflection signal to the second deflection system, regardless of which block pattern of the transmission mask 20 the electron beam is transmitted through. Actually however, the electron beam transmitted through a part P1 of the transmission mask 20 shown in FIG. 7 and the electron beam transmitted through a part P2 of the transmission mask 20 will not be irradiated at the corresponding parts of the wafer 28 because the distance from the optical axis is different between the parts P'1 and P2. The electron beam becomes distored as the distance between the part of the transmission mask 20 where the electron beam is transmitted through the transmission mask 20 and the optical axis increases. Accordingly, in order to accurately deflect the electron beam, it is necessary to measure beforehand the extent of the aberration which will occur relative to the distance between the optical axis and the part of the transmission mask 20 where the electron beam is transmitted through the transmission mask 20, and the deflection quantity of the electron beam must be corrected based on the measured data.

Next, a description will be given of the method of obtaining the above described errors.

Figure 8:
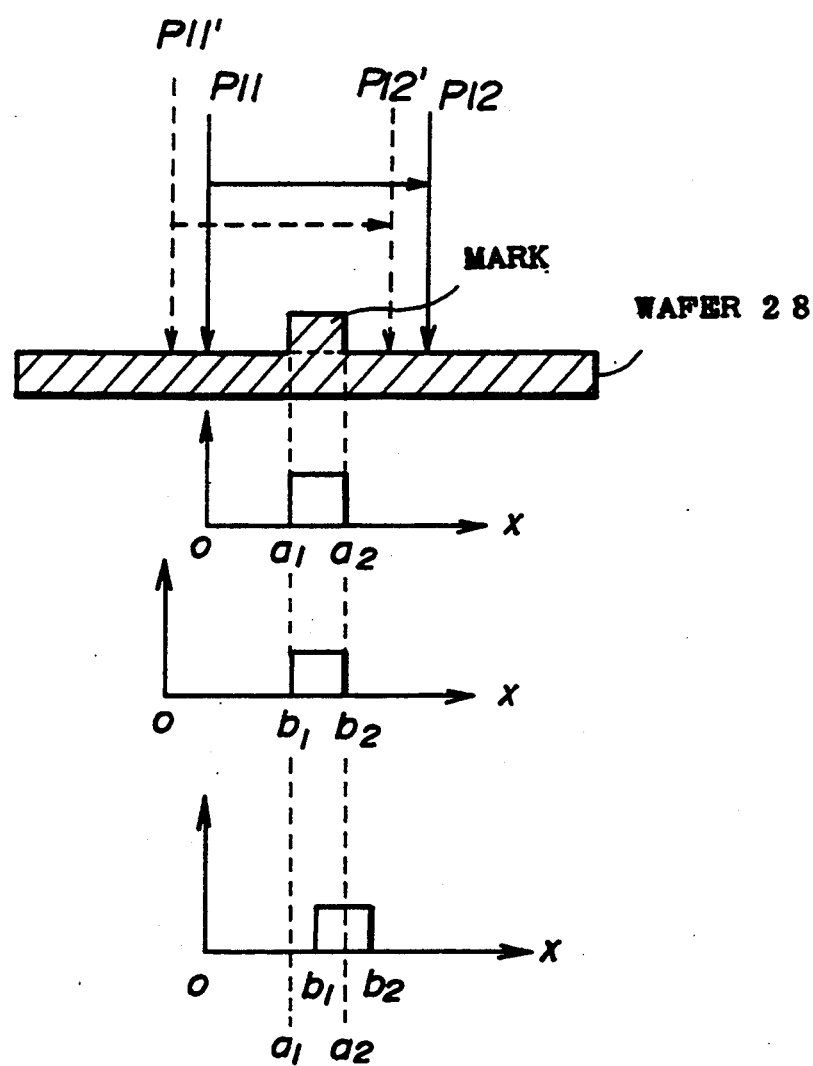
FIG. 8 is a diagram for explaining a method of obtaining the error.

One error is obtained by scanning a mark provided on the wafer 28 by the electron beam which is transmitted through one position matching pattern (mark) on the transmission mask 20. In other words, as will be explained in conjunction with FIG. 8, secondary electrons are emitted from the mark when the electron beam scans the mark provided on the wafer 28 and the electron beam hits the mark, and the position of the mark can be detected by detecting the amount of secondary electrons. For example, when a deflection signal is supplied to the second deflection system so as to scan the electron beam from a position P11 to a position P12 in FIG. 8 but the electron beam actually scans from a position P11' to a position P12', the amount of error is either a1-b1 or a2-b2. In this example, the electron beam scans only in the X-axis direction, but the electron beam actually scans similarly in the Y-axis direction.

Next, a description will be given of the methods of obtaining the correction amount of each block pattern based on measured error.

Figure 9:
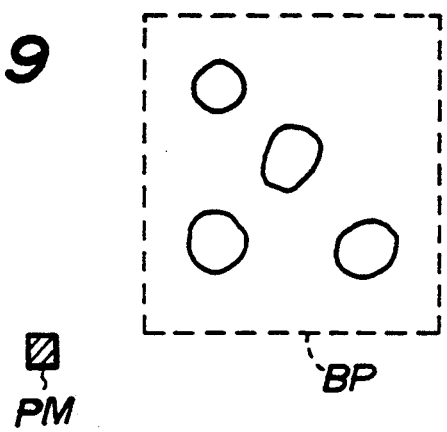
FIG. 9 is a diagram for explaining a first method of obtaining the correction amount of each block pattern based on measured error.

According to a first method, when one position matching pattern is provided in a vicinity of each block pattern of the transmission mask 20, the amount of error measured by a position matching pattern PM shown in FIG. 9 is regarded as being the same as the amount of error for a block pattern BP. Then, the data applied to the second deflection system is corrected so that the amount of error is cancelled. This method is superior in that the amount of error includes the two kinds of errors referred above, that is, the error caused by the shift of the coordinate system and the error caused by the aberration. However, since the position of the block pattern BP is not equal to the position of the position matching pattern PM, an error is introduced due to the difference in the positions of the block pattern BP and the position matching pattern PM. In addition, this method is troublesome to perform because one position matching pattern PM must be provided with respect to each block pattern BP and the amount of error must be measured for all the position matching patterns PM.

Figure 5:
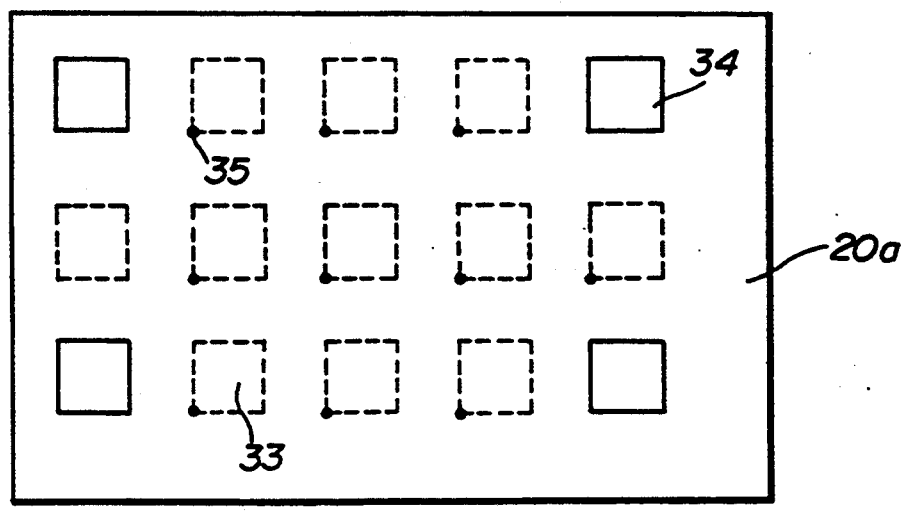
FIG. 5 is a plan view showing a second embodiment of the mask according to the present invention.

According to a second method, the amount of error is measured with respect to the position matching patterns 34 provided at four corners of the transmission mask 20a as shown in FIG. 5, and the amount of error of the block pattern which is provided at an arbitrary position on the transmission mask 20a is estimated from the measured amount of error. Then, when exposing each block pattern, the data supplied to the second deflection system is corrected so that the amount of error of the block pattern is cancelled.

Figure 10:
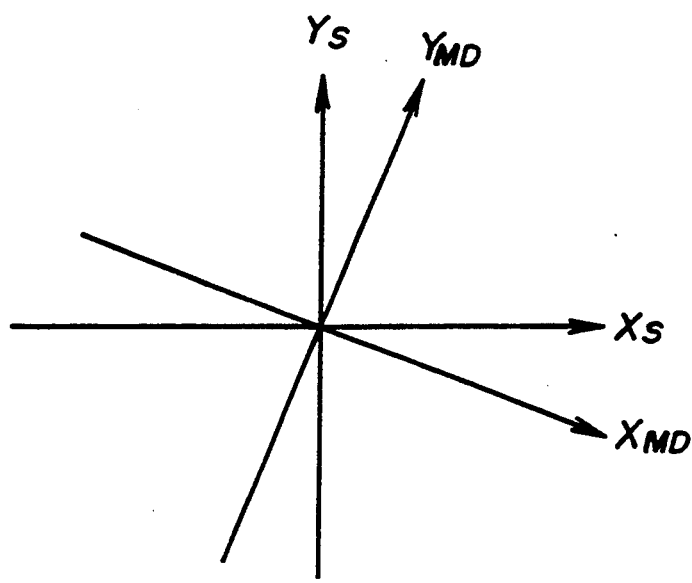
FIGS. 10 and 11 respectively are diagrams for explaining a second method of obtaining the correction amount of each block pattern based on the measured error.

The process of matching the coordinate system of the transmission mask 20a and the coordinate system of the second deflection system is equivalent to the process of inputting the coordinates of the coordinate system of the second deflection system and obtaining a transform equation which obtains the corresponding coordinates of the coordinate system of the transmission mask 20a. The following equations may be used to derive the corresponding ($X_{MD}$, $Y_{MD}$) coordinates from the ($X_S$, $Y_S$) coordinates as shown in FIG. 10.

$$X_{HD} = X_S + G_x X_S + R_x Y_S + H_x X_S Y_S + O_x$$

$$Y_{HD} = Y_S + G_y Y_S + R_y X_S + H_y X_S Y_S + O_Y$$

In the above equations, $G_x$, $R_x$, $H_x$ and $O_x$ are correction coefficients. When these correction coefficients $G_x$, $R_x$, $H_x$ and $O_x$ are obtained, it is possible to obtain the coordinate system of the transmission mask 20a from the coordinate system of the second deflection system. Since there are four correction coefficients $G_x$, $R_x$, $H_x$ and $O_x$, these correction coefficients $G_x$, $R_x$, $H_x$ and $O_x$ can be obtained by measuring four amounts of error. Similarly, $G_y$, $R_y$, $H_y$ and $O_y$ are also correction coefficients, but a description thereof will be omitted.

Therefore, when the amount of error obtained by the above measurement is denoted by $\Delta X$, the following equation stands.

$$\Delta X = (X_{MD} - X_S) = G_x X_S + R_x Y_S + H_x X_S Y_S + O_x$$

When the four amounts of error are denoted by $\Delta X1$, $\Delta X2$, $\Delta X3$ and $\Delta X4$, the following equations stand $$\Delta X1 = G_x X1 + R_x Y1 + H_x X1 Y1 + O_x$$

$$\Delta X2 = G_x X2 + R_x Y2 + H_x X2 Y2 + O_x$$

$$\Delta X3 = G_x X3 + R_x Y3 + H_x X3 Y3 + O_x$$

$$\Delta X2 = G_x X4 + R_x Y4 + H_x X4 Y4 + O_x$$

Figure 11:
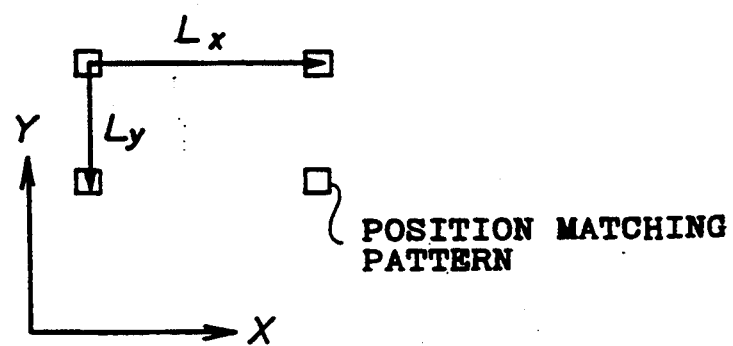

The above four equations can be solved for the correction coefficients $G_x$, $R_x$, $H_x$ and $O_x$ as follows, where $L_x$ and $L_y$ are shown in FIG. 11.

$$O_x = (\tfrac{1}{4})(\Delta X1 + \Delta X2 + \Delta X3 + \Delta X4)$$

$$G_x = (\tfrac{1}{4} L_x)(-\Delta X1 - \Delta X2 + \Delta X3 + \Delta X4)$$

$$R_x = (\tfrac{1}{4} L_y)(\Delta X1 - \Delta X2 - \Delta X3 + \Delta X4)$$

$$H_x = (1/L_x L_y)(-\Delta X1 + \Delta X2 - \Delta X3 + \Delta X4)$$

Therefore, the coordinate transform equations can be obtained in the above described manner. When these transform equations are obtained, it is possible to know the coordinates of the block pattern which is provided at the arbitrary position on the transmission mask 20a in the coordinate system of the second deflection system.

Even after the correction with regard to the coordinates is made, there still remains the deflection error of the electron beam caused by the aberration (distortion). In a case where the electron beam is deflected by the second deflection system so as to irradiate a coordinate (X, Y) on the wafer 28 but a coordinate (X', Y') on the wafer 28 is actually irradiated by the deflected electron beam, the following relationship exists between (X, Y) and (X', Y').

$$X' = X + G_x X^2 + R_x Y^2 + H_x X^2 Y^2 + O$$

$$Y' = Y + G_y Y^2 + R_y X^2 + H_y X^2 Y^2 + O$$

Accordingly, when four amounts of error, for both X-axis and Y-axis directions, are further measured by scanning the position matching pattern 34 and the coefficients G, R, H and 0 in the above equations are defined, it is possible to obtain the correction amount with respect to the block pattern which is provided at the arbitrary position on the transmission mask 20a.

Figure 12A:
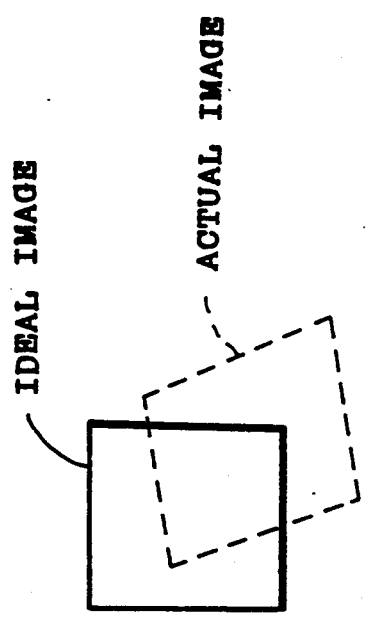
FIGS. 12A and 12B respectively are diagrams for explaining correction of the coordinate system and correction of the aberration.
Figure 12B:
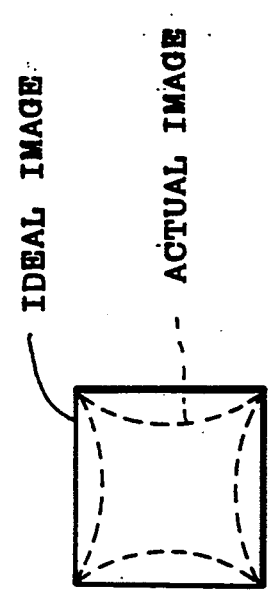

The correction of the coordinate system substantially corresponds to the position matching of the image as shown in FIG. 12A, while the correction of the aberration (distortion) corresponds to the position matching of the image as shown in FIG. 12B.

The second described correction method is superior compared to the first described correction method because it is possible to know the error and the correction amount for the mask pattern which is provided at the arbitrary position on the transmission mask from the errors of the limited number of position matching patterns provided on the mask.

In this embodiment, the following steps are carried out prior to the actual exposure of a desired pattern.

First, a first arbitrary position matching pattern 34 in the transmission mask 20 is selected by the pattern controller 6 and exposed at a predetermined position on the wafer 28. For example, a minute projection (mark) is provided at the predetermined position on the wafer 28. The irradiating position of the electron beam on the wafer 28 is detected by the reflected electron detector 30 and the waveform analyzer circuit 18. The data from the waveform analyzer circuit 18 is temporarily stored in the data memory 5 via the interface 4.

Second, a second arbitrary position matching pattern 34 in the transmission mask 20 is selected by the pattern controller 6 and exposed at the predetermined position on the wafer 28. This second arbitrary position matching pattern 34 is located at a position in the transmission mask 20 different from that of the first arbitrary position matching pattern 34. The data on the irradiating position of the electron beam on the wafer 28 is detected similarly as described above and temporarily stored in the data memory 5.

Third, the CPU 1 calculates the error in the irradiating positions of the electron beam between the two cases using the first and second arbitrary position matching patterns 34. In this embodiment, the error can be calculated with ease and with a high accuracy because the shape of the position matching patterns 34 are rectangular which makes it easy to detect the irradiating position of the electron beam. The calculated error is stored in the data memory 5.

Fourth, the first through third steps are repeated for the remaining position matching patterns 34 in the transmission mask 20.

Therefore, when an arbitrary pattern group 33 in the transmission mask 20 is selected to actually expose the desired pattern on the wafer 28, it is possible to correct the image distortion which is generated depending on the position of the selected pattern group 33 in the transmission mask 20. Because the positional relationship between each pattern group 33 or at least the reference point 35 of each pattern group 33 and at least one of the adjacent position matching patterns 34 are predetermined (fixed) and known, it is possible to calculate the correction amount for the selected pattern group 33 based on the calculated errors which are stored in the data memory 5. The pattern controller 6 controls the deflectors 50a and 50b via the DAC/AMP 7b based on the correction amount which is calculated in the CPU 1 so that the image distortion becomes a minimum. As a result, the electron beam is accurately irradiated at the intended position on the wafer 28 regardless of the position of the selected pattern group 33 in the transmission mask 20, that is, the image distortion is effectively eliminated so that the error becomes approximately zero.

The above described calculation of the errors prior to the actual exposure of the desired pattern may be carried out at an arbitrary frequency. In addition, the number and position of the position matching patterns 34 are not limited to those of FIG. 3. Further, the position matching pattern 34 may have an arbitrary shape as long as the positional errors between two exposures at the predetermined position on the wafer 28 is easily detectable by the reflected electron detector 30 and the waveform analyzer circuit 18.

As may be readily understood from the description given above, the method of calculating the correction amount basically depends on the number of the position matching patterns 34 formed in the transmission mask 20. When a relatively large number of position matching patterns 34 are provided in the transmission mask 20, it is for example possible to consider the error of the selected pattern group 33 to be approximately the same as the error of the closest position matching pattern 34 and calculate the correction amount based on the error of the closest position matching pattern 34. As an alternative, it is possible to calculate the error of the selected pattern group 33 from an interior division of the errors of the closest position matching patterns 34 which surround the selected pattern group 33 by the distances between the selected pattern group 33 and the closest surrounding position matching patterns 34. This latter method is especially suitable when the number of position matching patterns 34 is relatively small. Furthermore, although the deflection of the electron beam to selectively irradiate the selected pattern group 33 in the transmission mask 20 causes changes in rotation, reduction and horizontal position of the desired pattern which is exposed on the wafer 28, these changes can effectively be eliminated by the latter method.

The first embodiment of the transmission mask 20 has the position matching patterns 34 located at various positions in the transmission mask 20. For this reason, the number of pattern groups 33 which may be formed in the transmission mask 20 becomes limited by the existence of the position matching patterns 34.

Next, a description will be given of a second embodiment of the mask according to the present invention, by referring to FIG. 5. According to a transmission mask 20a shown in FIG. 5, the position matching patterns 34 are only provided at four corner portions of the transmission mask 20a. This embodiment is a more desirable than the first embodiment in that the position matching patterns 34 are provided at the outermost peripheral portion of the transmission mask 20a and the total number of the position matching patterns 34 is four, thereby leaving a large area for forming the pattern groups 33.

A description of the method of correcting the image distortion when using the transmission mask 20a will be omitted because the method is basically the same as that for the case described above where the transmission mask 20 is used. Of course, the latter method of calculating the correction amount is preferable when using the transmission mask 20a.

In the embodiments described heretofore, the mask and the method according to the present invention are applied to the production of semiconductor devices. However, it is of course possible to apply the present invention to the production of reticles and masks.

Further, the present invention is not limited to these embodiments, but various variations and modifications may be made without departing from the scope of the present invention.

What is claimed is:

1. A charged particle beam exposure method for exposing a desired exposure pattern on a substrate by a charged particle beam of a beam source and a deflection system for deflecting the charged particle beam transmitted through a mask, said charged particle beam exposure method comprising:

providing the mask having formed therein a plurality of exposure patterns and a plurality of position matching patterns, each of said position matching patterns having a predetermined, fixed positional relationship to at least an adjacent exposure pattern in the mask;

in a first step, exposing a first one of the plurality of position matching patterns in the mask at a predetermined position on the substrate by directing the charged particle beam through the selected position matching pattern in the mask and onto the predetermined position on the substrate;

in a second step, detecting the irradiating position of the charged particle beam on the substrate, as directed through said first position matching pattern;

in a third step, calculating an error between the predetermined position on the substrate and the irradiating position of the charged particle beam which is irradiated on the substrate through said first position matching pattern;

in a fourth step, determining a correction amount for the desired exposure pattern which is adjacent to said first position matching pattern in the mask based on the calculated error; and in a fifth step, controlling the deflection system based on the correction amount so that the calculated error becomes approximately zero.

2. The charged particle beam exposure method as claimed in claim 1, wherein, in the fourth step, the correction amount for the desired exposure pattern is determined to be the same as the correction amount calculated for the first position matching pattern.

3. The charged particle beam exposure method as claimed in claim 1, wherein said first through fifth steps are repeated for all the position matching patterns in the mask.

4. The charged particle beam exposure method as claimed in claim 1, wherein, in the fourth step, the correction amount for the desired exposure pattern is determined to be the same as the correction amount calculated for the first position matching pattern which is closest to the desired exposure pattern.

5. The charged particle beam exposure method as claimed in claim 1, wherein the first through fifth steps are repeated for a plurality of position matching patterns which are closest to and surround the desired exposure pattern in the mask, and the correction amount for the desired exposure pattern is determined by an interior division of the correction amounts, as calculated for the position matching patterns which are closest to and surround the desired exposure pattern, by the distances between the desired exposure pattern and the closest surrounding position matching patterns.

6. The charged particle beam exposure method as claimed in claim 1, wherein the exposure patterns and the position matching patterns are respectively arranged in corresponding matrix arrangements in the mask.

7. The charged particle beam exposure method as claimed in claim 6, wherein each of said position matching patterns has a rectangular shape.

8. The charged particle beam exposure method as claimed in claim 1, wherein the position matching patterns are arranged in a peripheral portion of the mask, the peripheral portion surrounding and defining a region in which the exposure patterns are formed.

9. The charged particle beam exposure method as claimed in claim 8, wherein the mask is of rectangular shape, having four corner portions, and the position matching patterns are arranged at four corner portions of the mask.

10. The charged particle beam exposure method as claimed in claim 9, wherein each of the position matching patterns has a rectangular shape.

11. The charged particle beam exposure method as claimed in claim 1, wherein each of the exposure patterns and of the position matching patterns is formed as holes in the mask.

12. The charged particle beam exposure method as claimed in claim 1, wherein each there is provided a reference point in each of the exposure patterns having a predetermined, fixed positional relationship to at least one of the position matching patterns adjacent to the corresponding exposure pattern.

13. A charged particle beam exposure method for exposing a desired exposure pattern on a substrate by a charged particle beam of a beam source and a deflection system for deflecting the charged particle beam transmitted through a mask, said charged particle beam exposure method comprising:

providing the mask having formed therein a plurality of exposure patterns and at least four position matching patterns, each of said four position matching patterns having a predetermined, fixed positional relationship to the exposure patterns in the mask;

in a first step, exposing the four position matching patterns in the mask at predetermined positions on the substrate by directing the charged particle beam through the four position matching patterns in the mask and onto the predetermined positions on the substrate;

in a second step, detecting the irradiating positions of the charged particle beam on the substrate, as directed through said four position matching patterns;

in a third step, calculating an error between each of the predetermined positions on the substrate and the corresponding irradiating positions of the charged particle beam which is irradiated on the substrate through said four position matching patterns;

in a fourth step, determining a correction amount for the desired exposure pattern in the mask based on the calculated errors; and in a fifth step, controlling the deflection system based on the correction amount so that the calculated error becomes approximately zero.

14. The charged particle beam exposure method as claimed in claim 13, wherein, in the fourth step, the correction amount for the desired exposure pattern is estimated from the correction amounts calculated for the four position matching patterns.

15. The charged particle beam exposure method as claimed in claim 13, wherein said first through fifth steps are repeated for all the position matching patterns in the mask.

16. The charged particle beam exposure method as claimed in claim 13, wherein the four position matching patterns surround the exposure patterns in the mask.

17. The charged particle beam exposure method as claimed in claim 13, wherein the exposure patterns are arranged in a matrix arrangement in the mask.

18. The charged particle beam exposure method as claimed in claim 17, wherein each of said position matching patterns has a rectangular shape.

19. The charged particle beam exposure method as claimed in claim 13, wherein the position matching patterns are arranged in a peripheral portion of the mask, the peripheral portion surrounding and defining a region in which the exposure patterns are formed.

20. The charged particle beam exposure method as claimed in claim 19, wherein the mask is of rectangular shape, having four corner portions, and the four position matching patterns are arranged at four corner portions of the mask.

21. The charged particle beam exposure method as claimed in claim 20, wherein each of the position matching patterns has a rectangular shape.

22. The charged particle beam exposure method as claimed in claim 13, wherein each of the exposure patterns and of the position matching patterns is formed as holes in the mask.

23. The charged particle beam exposure method as claimed in claim 13, wherein each there is provided a reference point in each of the exposure patterns having a predetermined, fixed positional relationship to at least one of the position matching patterns adjacent to the corresponding exposure pattern.

24. The charged particle beam exposure method as claimed in claim 13, wherein said fourth step determines the correction amount by taking into account an error caused by a shift of a coordinate system of the mask from a coordinate system of the deflection system, and an error caused by aberration.

25. A charged particle beam exposure method for exposing a desired exposure pattern on a substrate by a charged particle beam of a beam source and a deflection system for deflecting the charged particle beam transmitted through a mask, said charged particle beam exposure method comprising:

providing the mask having formed therein a plurality of exposure patterns and at least four position matching patterns, each of said four position matching patterns having a predetermined, fixed positional relationship to the exposure patterns in the mask;

in a first step, exposing, in succession, the four position matching patterns in the mask at predetermined positions on the substrate by directing the charged particle beam, in succession, through the four position matching patterns in the mask and onto the predetermined positions on the substrate;

in a second step, detecting the irradiating positions of the charged particle beam on the substrate, as directed through said four position matching patterns;

in a third step, calculating an error between each of the predetermined positions on the substrate and the corresponding irradiating positions of the charged particle beam which is irradiated on the substrate through said four position matching patterns;

in a fourth step, determining a correction amount for the desired exposure pattern in the mask based on the calculated errors; and in a fifth step, controlling the deflection system based on the correction amount so that the calculated error becomes approximately zero.

* * * * *

UNITED STATES PATENT AND TRADEMARK OFFICE
CERTIFICATE OF CORRECTION

PATENT NO. : 5,422,491
DATED : June 6, 1995
INVENTOR(S) : SAKAMOTO

It is certified that error appears in the above-indentified patent and that said Letters Patent is hereby corrected as shown below:

TITLE PAGE: [56] References Cited, under FOREIGN PATENT DOCUMENTS, insert:

-- 52-119185  10/1977  Japan
   62-260322  11/1987  Japan --

Signed and Sealed this

Fourteenth Day of November, 1995

Attest:

BRUCE LEHMAN

Attesting Officer   Commissioner of Patents and Trademarks